United States Patent
Lu (10) Patent No.: US 9,668,359 B2
(45) Date of Patent: May 30, 2017

(54) CIRCUIT MODULE HAVING SURFACE-MOUNT PADS ON A LATERAL SURFACE FOR CONNECTING WITH A CIRCUIT BOARD

(71) Applicant: CYNTEC CO., LTD., Hsinchu (TW)

(72) Inventor: Bau-Ru Lu, Changhua County (TW)

(73) Assignee: CYNTEC CO., LTD., Hsinchu (TW)

( * ) Notice: Subject to any disclaimer, the term of this patent is extended or adjusted under 35 U.S.C. 154(b) by 30 days.

(21) Appl. No.: 14/614,401

(22) Filed: Feb. 4, 2015

(65) Prior Publication Data

US 2016/0227649 A1    Aug. 4, 2016

(51) Int. Cl.
| | | |
|---|---|---|
| H05K 7/10 | (2006.01) | |
| H05K 7/12 | (2006.01) | |
| H05K 3/36 | (2006.01) | |
| H05K 1/11 | (2006.01) | |

(52) U.S. Cl.
CPC ............. *H05K 3/366* (2013.01); *H05K 1/117* (2013.01); *H05K 2201/09063* (2013.01); *H05K 2201/09172* (2013.01); *H05K 2201/1034* (2013.01); *H05K 2201/10295* (2013.01)

(58) Field of Classification Search
USPC .................................. 361/767, 808; 174/557
See application file for complete search history.

(56) References Cited

U.S. PATENT DOCUMENTS 6,222,739 B1*   4/2001   Bhakta ................... G06F 1/184
                                                                               257/686

\* cited by examiner

*Primary Examiner* — Andargie M Aychillhum
(74) *Attorney, Agent, or Firm* — Min-Lee Teng; Litron Patent & Trademark Office (57) ABSTRACT

A circuit module for connecting to a circuit board is disclosed, the circuit module for connecting to a circuit board, wherein the circuit module comprises a substrate having a top surface, a bottom surface and a lateral surface connecting the top surface and bottom surface, wherein at least one electrical component is disposed on the top or bottom surface and a plurality of surface-mount pads are disposed on the lateral surface of the substrate for electrically connecting to corresponding pads on the circuit board.

19 Claims, 10 Drawing Sheets

CIRCUIT MODULE HAVING SURFACE-MOUNT PADS ON A LATERAL SURFACE FOR CONNECTING WITH A CIRCUIT BOARD

BACKGROUND OF THE INVENTION

I. Field of the Invention the present invention relates to a board design, and in particularly, to a circuit module design for connecting with a circuit board.

II. Description of the Prior Art

As an electronic system becomes smaller and smaller, the overall system level design must consider size requirements as well as usable layout areas in the circuit board or the circuit modules that will be connected to the circuit board. Usually, there is a motherboard in a system on which multiple circuit modules are attached to the motherboard. In order to save space, the circuit module stands on the mother board using a lateral surface of the circuit module, wherein electronic devices are disposed or mounted on the top or bottom surface of the circuit module.

when designing a system with multiple circuit boards (PCB), the interconnection between a circuit module and the motherboard is very important. As more and more components or boards are integrated into a system, such as a server, reducing the size of the system while increasing the electrical performance of the system becomes a bottleneck of designing the overall system. Conventionally, connectors are used for connecting different boards; however, the connectors take up a large space in both the circuit module and the circuit board to which the circuit module is connected to. In addition, the connectors will block usable layout area due to the fact that the connectors are usually mounted on the boards by using through-hole pins.

In addition, the connectors that are used to connect the circuit module and the circuit board or motherboard will degrade the electrical performance such that the frequency of the signals passing through the connectors must be lowered in order to maintain reliable operations.

accordingly, the present invention proposes an effective way to connect a circuit module with a circuit board to overcome the above-mentioned disadvantages.

SUMMARY OF THE INVENTION

One objective of the present invention is to provide a circuit module for connecting to a circuit board or a motherboard by using surface-mounting pads on a lateral surface of the circuit module so as to reduce the connecting space between the circuit module and the circuit board.

In one embodiment, a circuit module for connecting to a circuit board is disclosed, wherein the circuit module comprises a substrate having a top surface, a bottom surface and a lateral surface connecting the top surface and bottom surface, wherein at least one electrical component is disposed on the top or bottom surface and a plurality of surface-mount pads are disposed on the lateral surface of the substrate for electrically connecting to corresponding pads on the circuit board.

In one embodiment, each of the plurality of surface-mount pads is created through a through-hole via between the top surface and bottom surface with an opening on the lateral surface of the circuit module.

In one embodiment, each of the plurality of surface-mount pads is created through an embedded via with an opening on the lateral surface of the circuit module.

In one embodiment, the at last one electronic device comprises at least one of capacitor, resistor, diode, MOSFET, a bare die, and an IC.

In one embodiment, at least one positioning pin is disposed on the lateral surface of the circuit module for respectively plugging into at least one through hole of the circuit board.

In one embodiment, at least one through hole is disposed on the lateral surface of the circuit module for respectively accepting at least one pin of the circuit board.

In one embodiment, one of the at least one positioning pin is electrically connected to a ground of the circuit board.

In one embodiment of the present invention, one of the at least one positioning pin is electrically connected to a power source of the circuit board.

In one embodiment, a first positioning pin is electrically connected to a ground of the circuit board and a second positioning pin is electrically connected to a power source of the circuit board.

In one embodiment, the at least one positioning pin is thermally conductive to dissipate heat from electrical components of the circuit module.

In one embodiment, each of the at least positioning pin is made as a protrusion portion on the lateral surface of the substrate.

In one embodiment, the substrate comprises an assembly hole on the lateral surface of the substrate, wherein a positioning pin is inserted into the assembly hole.

In one embodiment, the at least one positioning pin comprises a first and second positioning pin, wherein the first positioning pin is parallel to the second positioning pin with a gap between the first and second positioning pin, wherein each of the first and second positioning pin is respectively inserted into a corresponding through hole of the circuit board.

In one embodiment, a system is disclosed, the system comprising: a circuit module, comprising a first substrate having a first top surface, a first bottom surface and a first lateral surface connecting the first top surface and the first bottom surface, wherein at least one positioning pin and a first plurality of surface-mount pads are disposed on the first lateral surface of the first substrate; and a circuit board, comprising a second substrate having a second top surface, a second bottom surface and a second lateral surface connecting the second top surface and the second bottom surface, wherein the second substrate comprises at least one through hole on the second top surface or the second bottom surface to accept said at least one positioning pin on the first lateral surface of the first substrate and a second plurality of surface-mount pads electrically connected to the first plurality of surface-mount pads on the first lateral surface of the circuit module.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF THE INVENTION

The detailed explanation of the present invention is described as following. The described preferred embodiments are presented for purposes of illustrations and description, and they are not intended to limit the scope of the present invention.

The following embodiments disclose a circuit module for connecting to a circuit board, wherein the circuit module comprises a substrate having a top surface, a bottom surface and a lateral surface connecting the top surface and bottom surface, wherein at least one electrical component is disposed on the top or bottom surface and a plurality of surface-mount pads are disposed on the lateral surface of the substrate for electrically connecting to corresponding pads on the circuit board.

Figure 1:
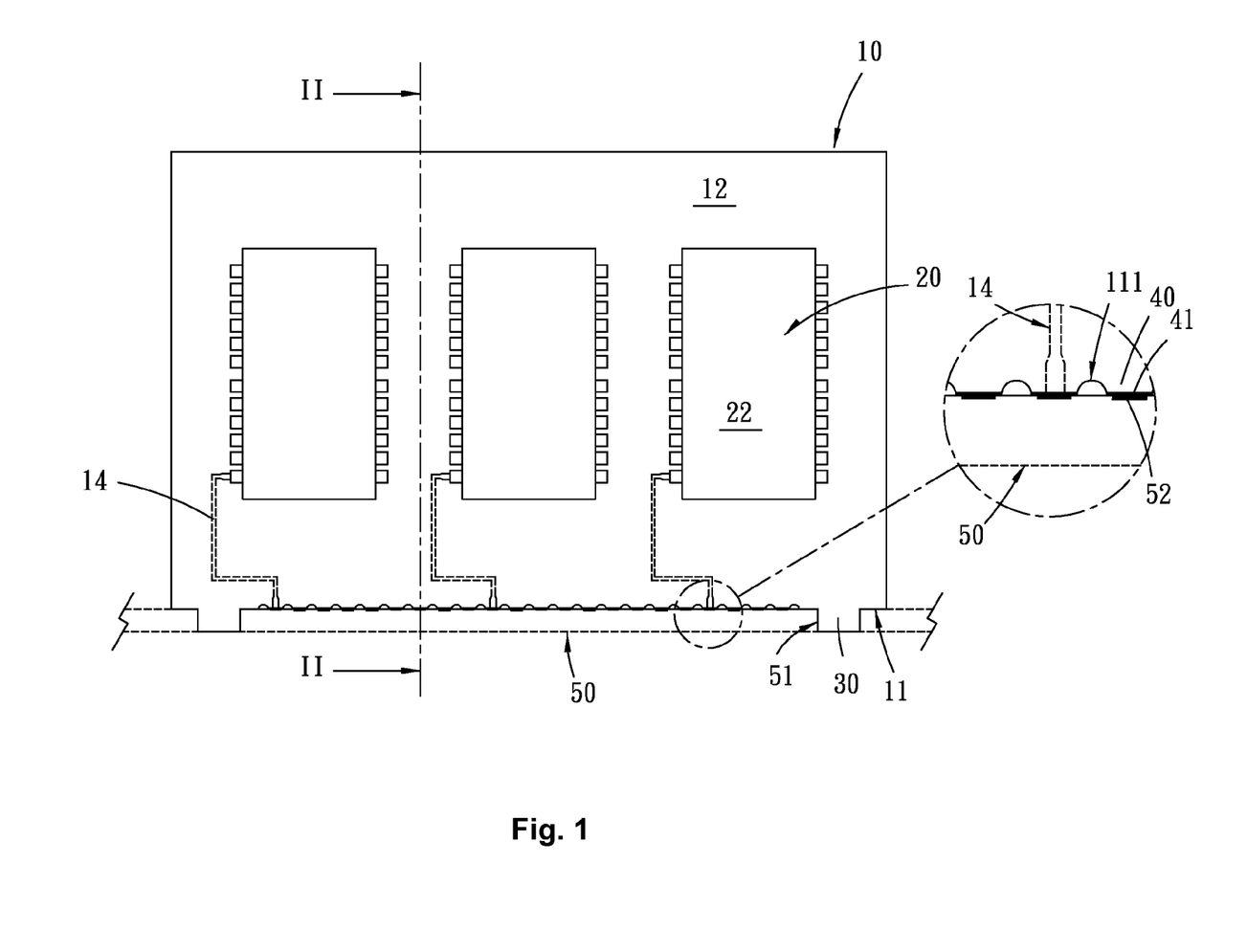
FIG. 1 is a front view of a circuit module having surface-mount pads on a lateral surface thereof according to one embodiment of present invention.
Figure 2:
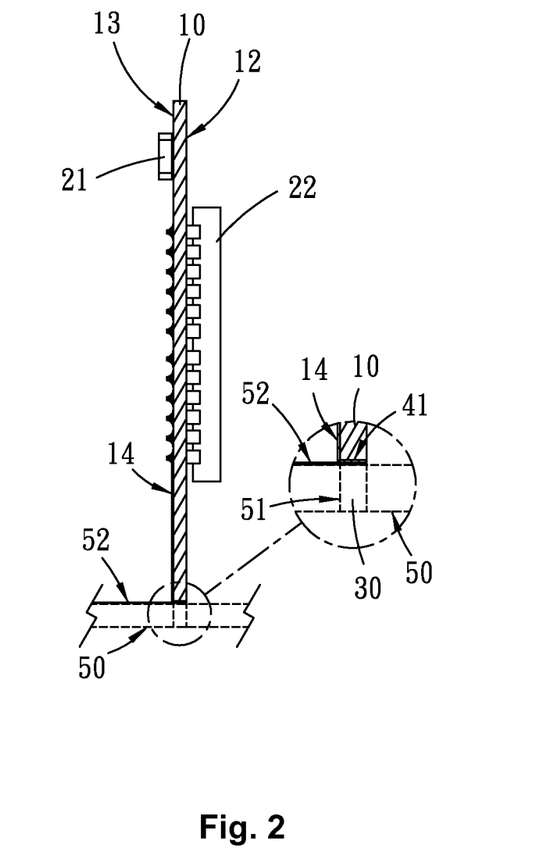
FIG. 2 is a sectional view of the II-II portion in FIG. 1.

Please refer to FIG. 1 and FIG. 2, which illustrates a front view and a sectional view of the structure of a surface-mount type circuit module in one embodiment of the present invention, wherein the surface-mount type circuit module comprises: a substrate 10 having a top surface, a bottom surface and a lateral surface connecting the top surface and the bottom surface, at least one electronic device 20 is disposed on the top or bottom surface of the substrate, at least one positioning pin 30 and a plurality of surface-mount pads 40. The plurality of surface-mount pads 40 in FIGS. 1 and 2 will be electrically connected to corresponding pads on a circuit board 50 by using surface-mount soldering technology, and the circuit module stands upright on the circuit board 50 uses surface-mount pads 40 to electrically connect with corresponding surface-mount pads on the circuit board 50 without using any conventional connector or protruded pins so as to reduce through-hole pins on the circuit board 50, thereby increasing internal usable layout area of the circuit board 50. By doing so, routing complexity in the layout of the circuit board 50 can be reduced and more circuit modules can be attached to the circuit board 50, thus reducing the overall size of the system while increasing the electrical performance of the system. The circuit board 50 can be a motherboard in a computer, server or any electronic device.

The substrate 10 has a lateral surface 11, a top surface 12 and a bottom surface 13 opposite to the top surface 12, wherein at least one electronic device 20 is disposed on the top or bottom surface, but not limited to only the top or bottom surface; that is, electronic devices can be disposed on both the top surface and the bottom surface as well. In some embodiment, electronic device can be embedded in the substrate. The substrate 10 comprises electrical connections 14, which is usually made as wires or traces in the circuit board, and pads to connect all the electronic devices 20 that are disposed on the circuit board. In one embodiment, the substrate 10 is a printed circuit board (PCB), the electrical connections 14 and the pads are made through a PCB manufacturing process. Pads on the substrate 10 can be in many forms for connecting a through-hole pin of a DIP type electronic device 22, a surface-mount pad of a surface-mount device (SMD) 21 or COB type electronic device 23 (see FIG. 4). In order to increase the mechanic strength when the circuit module is mounted to the circuit board 50, in one embodiment, at least a positioning pin 30 along with the surface-mount pads 40 are disposed on the lateral surface of the substrate 11, the positioning pin 30 will be inserted into a through hole 51 of the circuit board 50. In one embodiment, two positioning pins 30 and 60 are disposed on the lateral surface of the substrate 11 to further enhance the mechanic strength when the circuit module is mounted to the circuit board 50.

In one embodiment, surface-mount pads 40 have an adhesive surface 41, which is conductive so as to electrically connect electronic devices 20 of the circuit module with the circuit 52 of the circuit boards 50, so the electronic pin member 20 can mount circuit 52 electrically connected to the circuit board 40 and the surface 50 through the use of surface-mount pads 40 and circuit 52. In one embodiment, each of the surface-mount pads 40 on the lateral surface of the circuit module can be used to connect a signal, a power source or a ground of the circuit board 50.

In one embodiment, the positioning pins 30 and the surface-mount pads 40 surface-mount are directly formed on the lateral surface 11 the substrate 10. As shown in FIG. 1 and FIG. 2, each of the positioning pins 30 is formed by a protrusion portion on the lateral surface 11 of the substrate 10. There are multiple spaced recesses 111 formed on the lateral surface 11 of the substrate 10, wherein the portion of the substrate between each two adjacent recesses 111 can be used to form a surface-mount pad 40 which connects to a terminal of a device disposed on the top or bottom surface of the substrate 10. A surface-mount pad 40 can further include an adhesive conductive layer 41 on the top surface of the surface-mount pad 40 to strengthen the connectivity between the circuit module and the circuit board. One way to form a surface-mount pad 40 is through electro-plating technology. The material of the surface-mount pad 40 can be in many forms such as Ag, Sn, Cu, gold or in combination of them. Once the circuit module is positioned upright on the circuit board 50 by inserting the positioning pins 30 into corresponding through-holes on the circuit board 50, the surface-mount pads 40 can be soldered with corresponding pads on the circuit board 50 to electrically connect electronic devices of the circuit module to the circuit 52 of the circuit board 50. In one embodiment, each of the plurality of surface-mount pads is created through a through-hole via between the top surface and bottom surface with an opening on the lateral surface of the circuit module. In one embodiment, each of the plurality of surface-mount pads is created through an embedded via with an opening on the lateral surface of the circuit module. In one embodiment, at least one through hole is disposed on the lateral surface of the circuit module for respectively accepting at least one pin of the circuit board.

In one embodiment, the positioning pin 30 is conductive and can be used as a pin for electrically connecting the circuit module and the circuit board. For example, the positioning pin 30 can be connected to a power source, a ground or a signal on the circuit board 50. In one embodiment, the electronic device 20 can be electrically connected the positioning pin 30 through the circuit line 14, wherein a conductive metal layer can be disposed on an area covering the circuit line 14 and extending to the positioning pin 30. In one embodiment, the positioning pin 30 can be thermally conductive to dissipate heat from electrical components of the circuit module.

Figure 3:
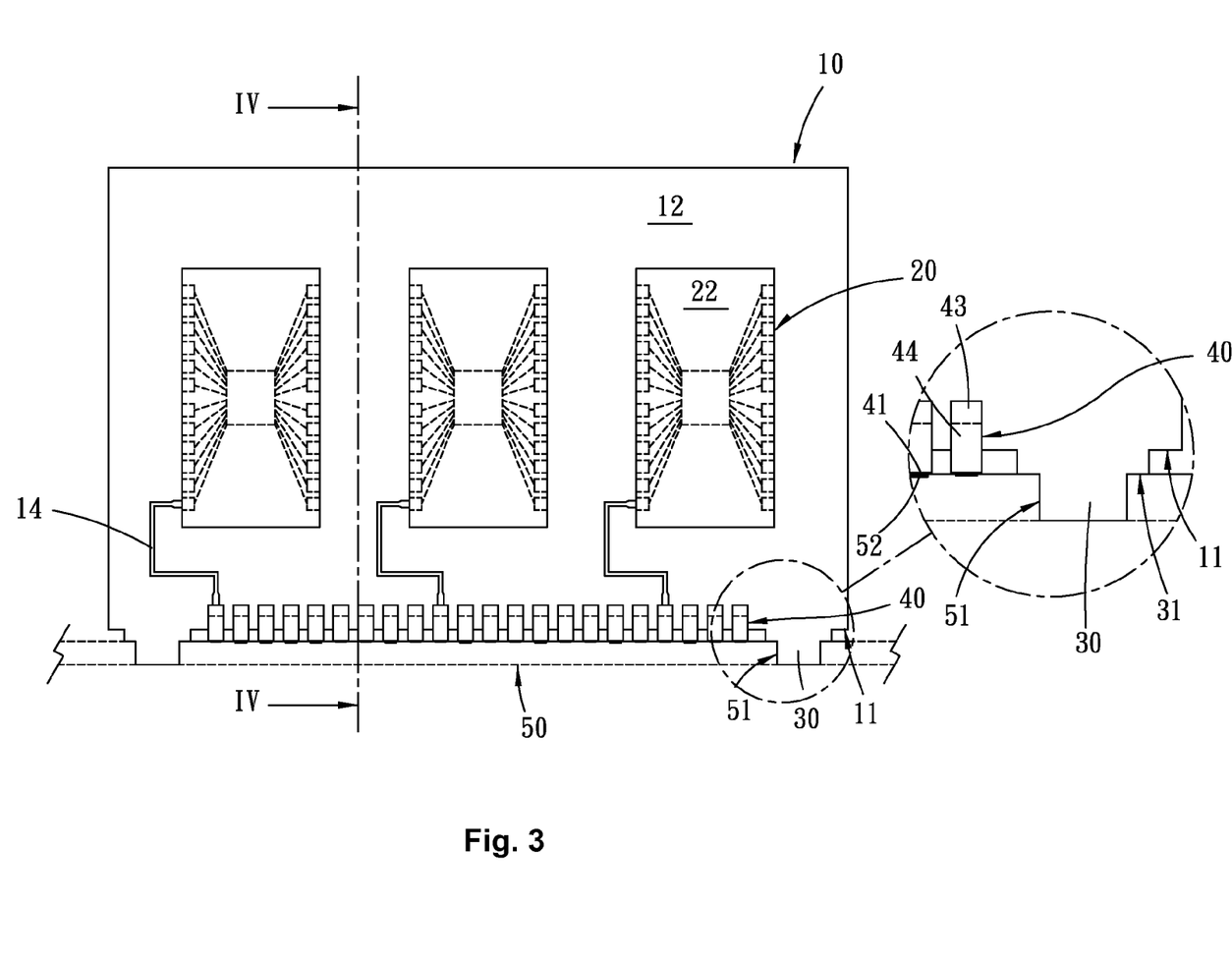
FIG. 3 is a front view of a circuit module having surface-mount pads and a positioning pin on a lateral surface thereof according to another embodiment of present invention.
Figure 4:
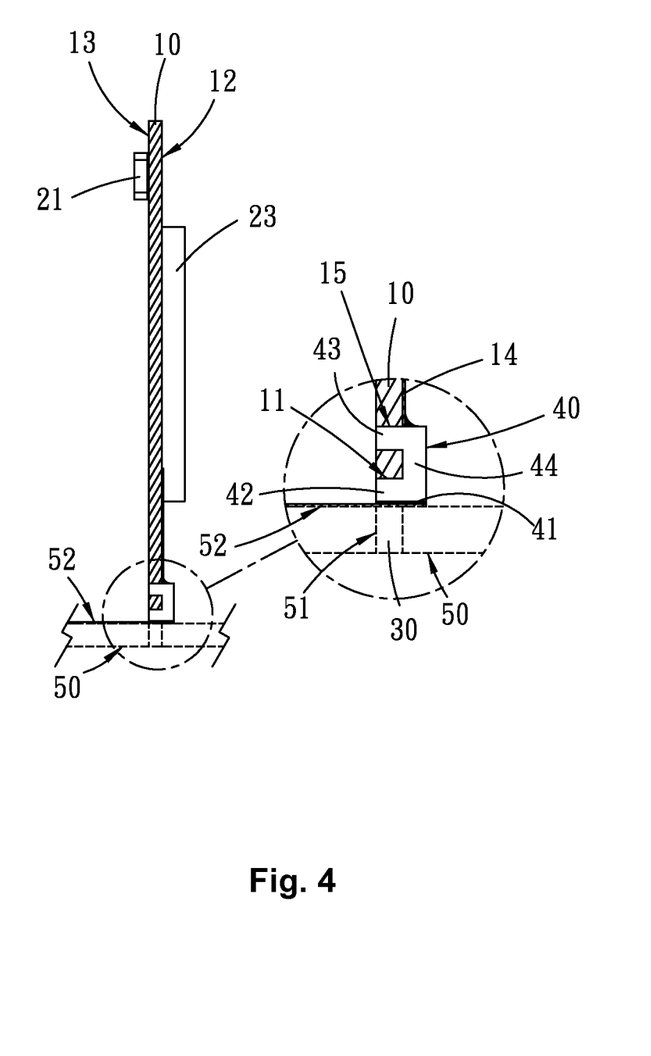
FIG. 4 is a sectional view of the IV-IV portion in FIG. 3.

Please refer to FIG. 3 and FIG. 4, in another embodiment of the present invention, the surface-mount pad 40 are embedded into a set of assembly holes 15 along the lateral surface 11 of the substrate 10. The surface-mount pad 40 is made of electrically conducting material in many different shapes, such as a sheet, a pillar, but it is not limited to. The surface-mount pad 40 comprises an adhesive mounting block 42, an insertion end 43 and a connecting portion 44, which are arranged as a C-like shape, wherein the insertion end 43 is inserted into an assembly holes 15 and is fixed with the substrate 10 by soldering or gluing. The upper surface of adhesive mounting block 42 abuts on the side wall of the assembly holes 15. The adhesive conductive layer 41 is disposed on the lower surface of adhesive mounting block 42. In one embodiment, the connecting portion 44 abuts on the surface of the substrate 10 to connect the insertion end 43 and the adhesive block 42, but it is not limited to. By doing so, each of the surface-mount pads 40 has a larger adhesive surface to strengthen the connectivity between the circuit module and the circuit board.

Please refer to FIG. 3, in one embodiment of the present invention, the positioning pin 30 has a supporting surface 31 abuts surrounding surface of the through hole 51 of the circuit board 50 to create a gap between the electronic device 20 and the circuit board 50 so as to increase airflow therebetween.

Figure 5:
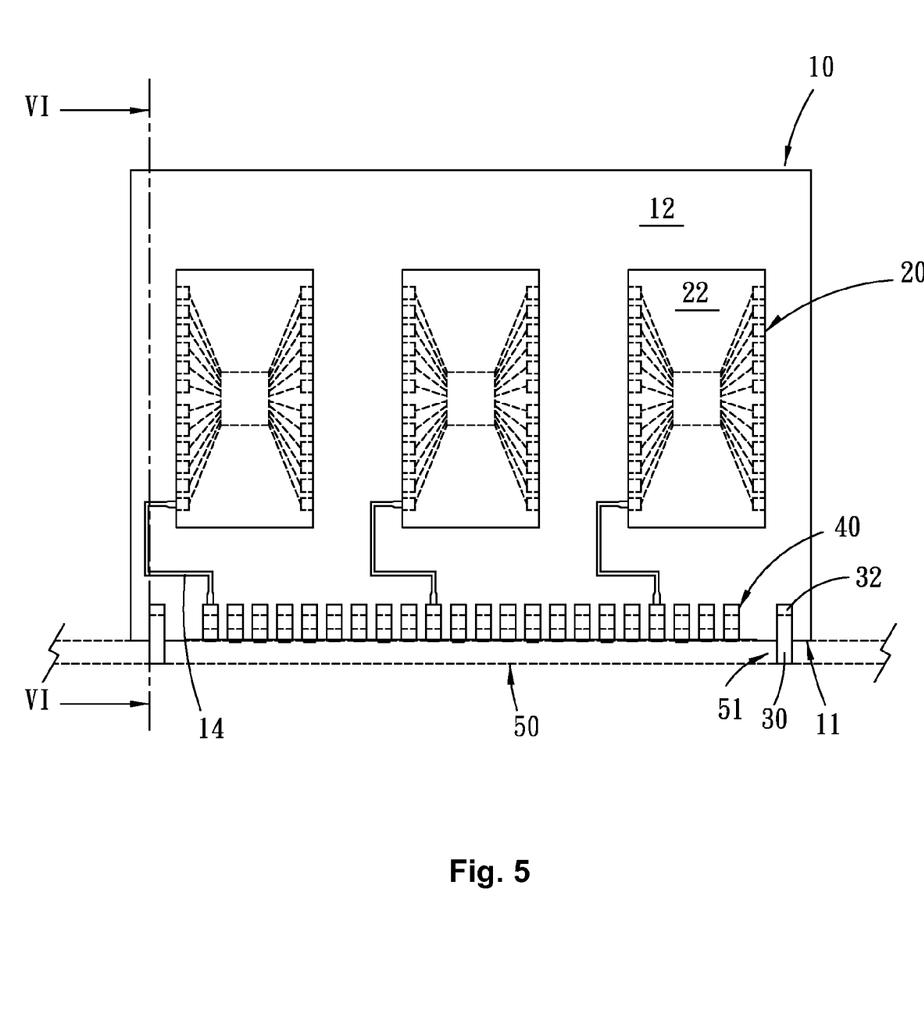
FIG. 5 is a front view of a circuit module having surface-mount pads on a lateral surface thereof according to yet another embodiment of present invention.
Figure 6:
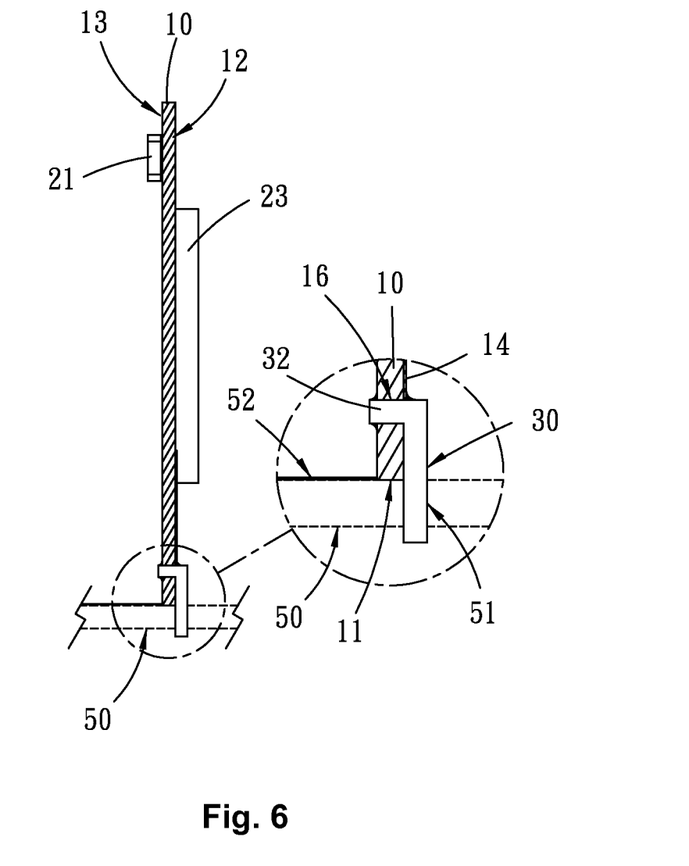
FIG. 6 is a sectional view of the VI-VI portion in FIG. 5.

Please refer to FIGS. 5 and 6, in another embodiment of the present invention, there is a set of assembly holes 16 along the lateral surface 11 of the substrate 10 for housing the positioning pins 30. Positioning pins 30 can be affixed to the surface of the substrate 10 for inserting into the through hole 51 of the circuit board 50. The positioning pin 30 can abut on the first surface 12, but not limited to. One end of the positioning pin 30 has an insertion end 32, wherein an insertion end 32 is inserted into the corresponding holes 16 and fixed with the substrate 10 by soldering or gluing. Other descriptions are the same as descriptions for FIG. 3 and FIG. 4.

Figure 7:
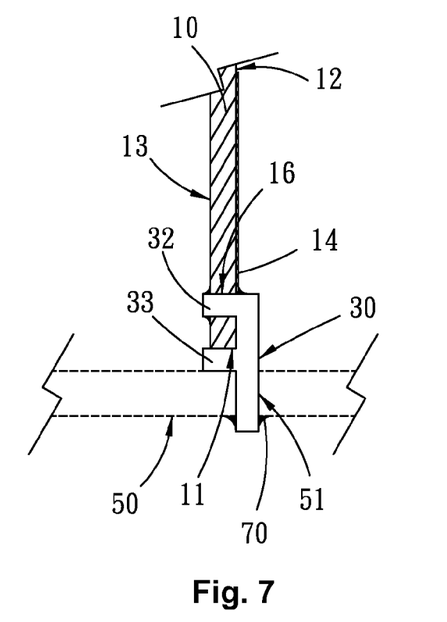
FIG. 7 illustrates a first auxiliary portion for supporting the structures of the positioning pin according to another embodiment of present invention.
Figure 8:
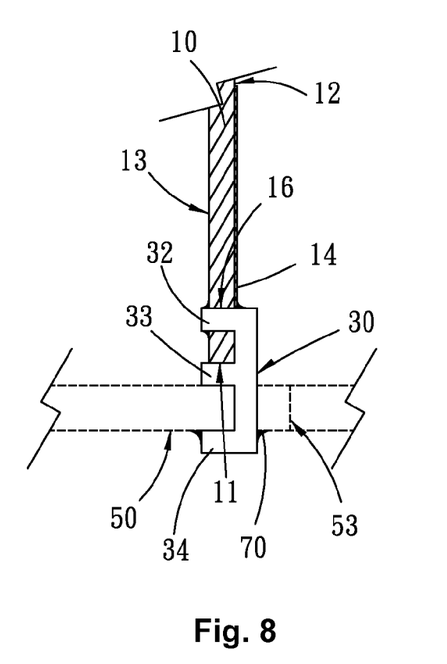
FIG. 8 illustrates a first auxiliary portion and a second auxiliary portion for supporting the structures of the positioning pin according to another embodiment of present invention.

FIG. 7 illustrates a structure of the positioning pin 30 according to another embodiment of present invention. The difference between FIG. 7 and FIG. 6 is that the positioning pin 30 has a first auxiliary portion 33 on the lateral surface 11 of the substrate. The first auxiliary portion 33 extends in a direction from one side of the positioning pin 30 toward the substrate 10, wherein the first auxiliary portion 33 can abut on the side 11 so as to increase the structural strength between the positioning pin 30 and the substrate 10. FIG. 8 illustrates a structure of the positioning pin 30 according to another embodiment of present invention. The difference between FIG. 8 and FIG. 7 is that the positioning pin 30 has a second first auxiliary portion 34 in addition to the first auxiliary portion 33. The first auxiliary portion 33 is parallel to the second auxiliary portion 34 with a gap between each other. The second auxiliary portion 34 and the positioning pin 30 can pass through a through hole 53 of the circuit board 50. The shape of the through hole 53 can be rectangular with a narrow width. Alternatively, the first and second auxiliary portion 34 can be disposed on an edge of the circuit board 50 so as to clamp on the circuit board 50 to increase the structural strength between the positioning pin 30 and the substrate 10. In one embodiment, the second positioning pin 30A is conductive and can be used as a pin for electrically connecting the circuit module and the circuit board 50. For example, the positioning pin 30 and the second positioning pin 30A can be respectively connected to a power source, a ground or a signal on the circuit board 50.

Figure 9:
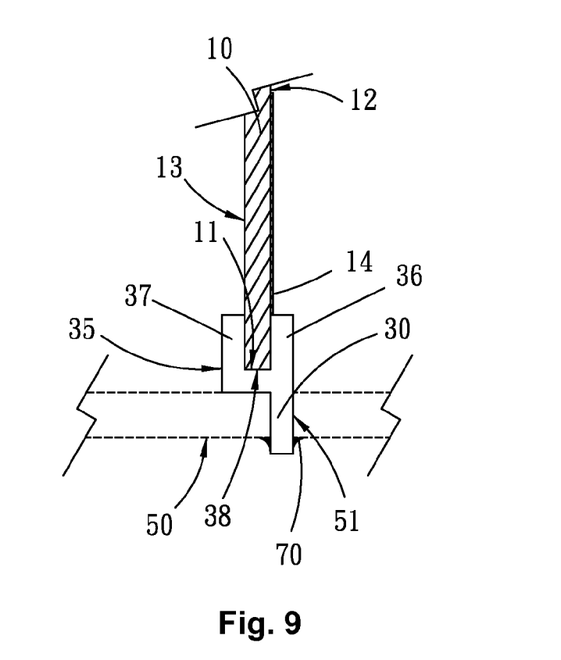
FIGS. 9-11 illustrates different clamping ways to clamp the positioning pin on the lateral surface of the substrate with a clamping part according to one embodiment of present invention.
Figure 10:
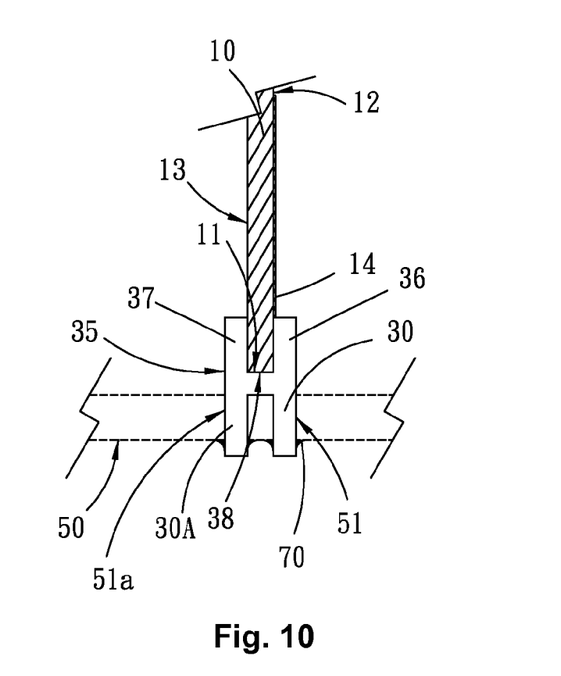
Figure 11:
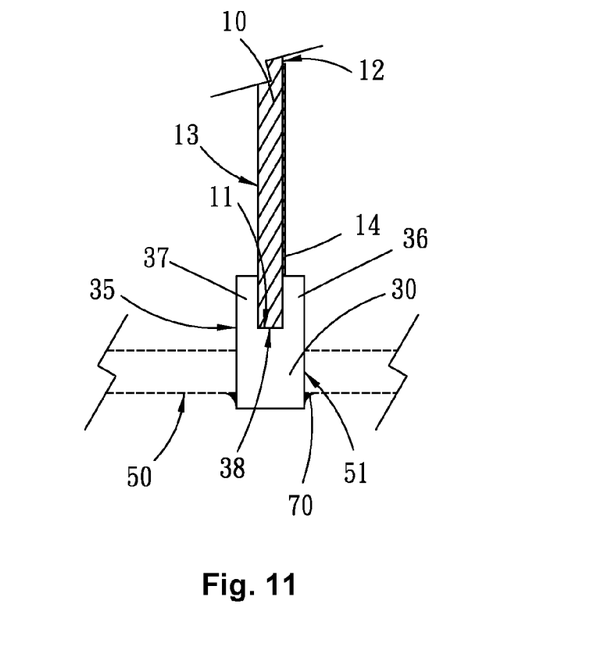

In another embodiment of the present invention, the positioning pin 30 is clamped on the lateral surface 11 of the substrate 10, Please refer to FIG. 9 to FIG. 11, which illustrates different clamping ways to clamp the positioning pin 30 on the lateral surface 11 of the substrate 10. In FIG. 9 and FIG. 11, the positioning pin 30 has a clamping part 35 which comprises a first protrusion portion 36, a second protrusion portion 37 and a jaw opening 38 interposed therebetween. The positioning pin 30 is clamped on the lateral surface 11 of the substrate 10 by the first protrusion portion 36 and the second protrusion portion 37, wherein the first protrusion portion 36 and the second protrusion portion 37 can be further affixed to the substrate 10 by soldering or gluing, or any other suitable means, so as to increase the structural strength between the positioning pin 30 and the substrate 10. The difference between FIG. 10 and FIG. 9 is that FIG. 10 further includes a second positioning pin 30A. The second positioning pin 30A is parallel to the positioning pin 30 with a gap between each other. The second positioning pin 30A and the positioning pin 30 are inserted into the through holes 51, 51a of the circuit board 50 respectively, so as to increase the structural strength between the positioning pin 30 and the circuit board 50, especially when electronic devices are disposed on both top and bottom surfaces of the substrate 10.

Figure 12:
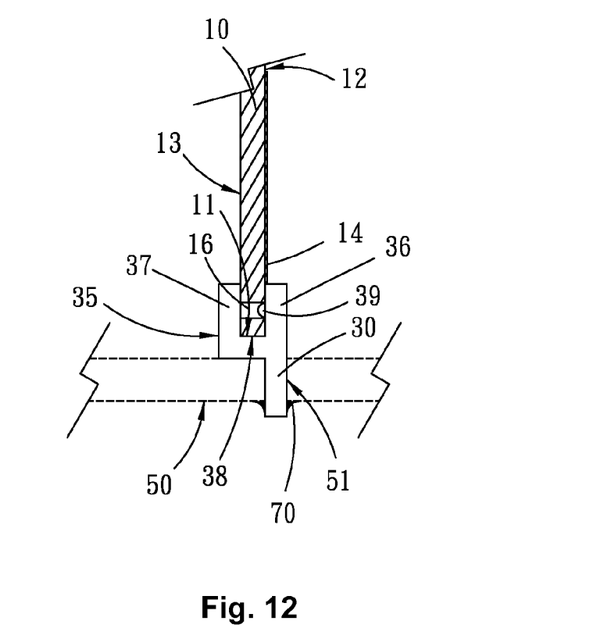
FIGS. 12-14 illustrates a bump, associated with the clamping part illustrated in FIGS. 9-11, for buckling with an assembly hole.
Figure 13:
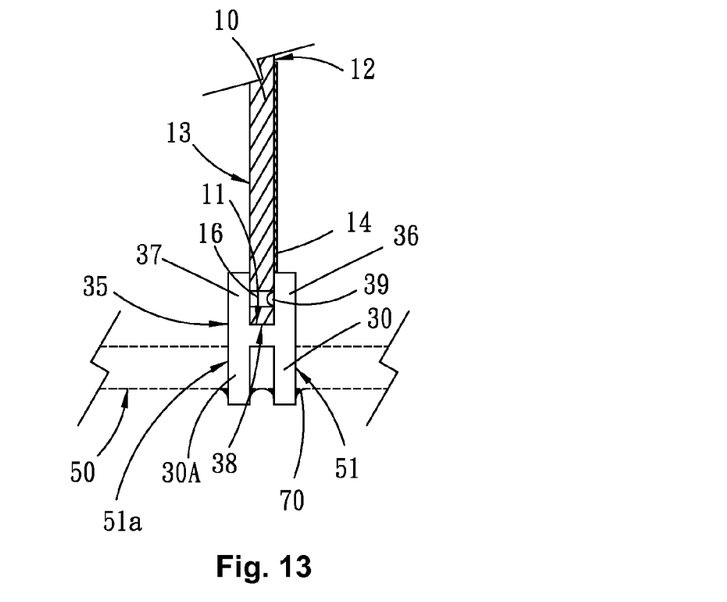
Figure 14:
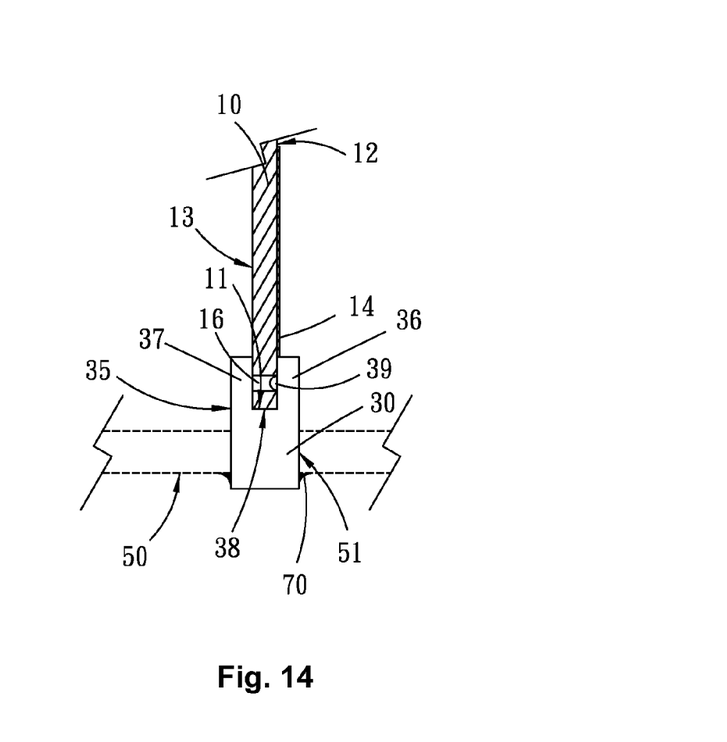

Please refer to FIG. 12 to FIG. 14, which illustrates a different way to clamp the positioning pin 30 corresponding to the structure in FIG. 12 to FIG. 14 respectively, wherein the clamping part 35 has a bump 39 for buckling with the second assembly hole 16 of the substrate 10, so as to increase the structural strength between the positioning pin 30 and the substrate 10.

Please note that, in some embodiments, the positioning pins 30 can be fixed in the through hole 51 of the circuit board 50 by soldering or gluing or any other suitable ways. In some embodiments, the positioning pins 30 are not necessary because the system design ensure all the circuit boards are mechanically stable by using pads with a larger portion embedded in the circuit module. That is, the surface-mounting pad has a larger body embedded inside the substrate of the circuit module so that it can strengthen the connectivity between the circuit module and the circuit board. In some embodiments, the circuit module can be design with a larger length and width, but with a smaller height, so that the surface-mounting pads is good enough to maintain the mechanic stability between the circuit module and the circuit board. In some of the embodiment, the size of each surface-mounting pads can vary for improving the mechanic stability between the circuit module and the circuit board.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A circuit module for connecting to a circuit board, wherein the circuit module comprises a substrate having a top surface, a bottom surface and a lateral surface connecting the top surface and the bottom surface, wherein at least one electrical component is disposed on the top surface or the bottom surface of the substrate and a plurality of surface-mount pads disposed on the lateral surface of the substrate, wherein each of the plurality of surface-mount pads disposed on the lateral surface of the substrate is in contact with and electrically connected to a corresponding pad disposed on the top surface of the circuit board.

2. The circuit module according to claim 1, wherein a first electronic device is disposed on the top surface of the substrate and a second electronic device is disposed on the bottom surface of the substrate.

3. The circuit module according to claim 1, wherein each of the plurality of surface-mount pads is created through a through-hole via between the top surface and the bottom surface of the substrate with an opening on the lateral surface of the substrate, wherein the through-hole via is filled with conductive material.

4. The circuit module according to claim 1, wherein each of the plurality of surface-mount pads is created through an embedded via with an opening on the lateral surface of the substrate, wherein the embedded via is filled with conductive material.

5. The circuit module according to claim 1, wherein the plurality of surface-mount pads has two group of pads with different pad sizes.

6. The circuit module according to claim 1, wherein each of the plurality of surface-mount pads comprises adhesive material for connecting with a corresponding pad disposed on the top surface of the circuit board.

7. The circuit module according to claim 1, wherein at least one positioning pin is disposed on the lateral surface of the substrate for respectively plugging into at least one through hole of the circuit board.

8. The circuit module according to claim 7, wherein one of the at least one positioning pin is electrically connected to a ground of the circuit board.

9. The circuit module according to claim 7, wherein one of the at least one positioning pin is electrically connected to a power source of the circuit board.

10. The circuit module according to claim 7, wherein a first positioning pin is electrically connected to a ground of the circuit board and a second positioning pin is electrically connected to a power source of the circuit board.

11. The circuit module according to claim 7, wherein the at least one positioning pin is thermally conductive to dissipate heat from electrical components of the circuit module.

12. The circuit module according to claim 7, wherein each of the at least positioning pin is made as a protrusion portion on the lateral surface of the substrate.

13. The circuit module according to claim 7, wherein the at least one positioning pin comprises a first and second positioning pin, wherein the first positioning pin is parallel to the second positioning pin with a gap between the first and second positioning pin, wherein each of the first and second positioning pin is respectively inserted into a corresponding through hole of the circuit board.

14. The circuit module according to claim 1, wherein at least one through hole is disposed on the lateral surface of the substrate for respectively accepting at least one pin of the circuit board.

15. The circuit module according to claim 1, wherein the substrate is a printed circuit board.

16. The circuit module according to claim 1, wherein the substrate comprises an assembly hole on the lateral surface of the substrate, wherein a positioning pin is inserted into the assembly hole.

17. A system comprising:
a circuit module, comprising a first substrate having a first top surface, a first bottom surface and a first lateral surface connecting the first top surface and the first bottom surface, wherein at least one electrical component is disposed on the first top surface or the first bottom surface of the first substrate, wherein at least one positioning pin and a first plurality of surface-mount pads are disposed on the first lateral surface of the first substrate; and
a circuit board, comprising a second substrate having a second top surface, a second bottom surface and a second lateral surface connecting the second top surface and the second bottom surface, wherein the second substrate comprises at least one through hole to accept said at least one positioning pin on the first lateral surface of the first substrate and a second plurality of surface-mount pads disposed on the second top surface of the second substrate, wherein each of the first plurality of surface-mount pads on the first lateral surface of the first substrate is in contact with and electrically connected to a corresponding surface-mount pad of the second plurality of surface-mount pads disposed on the second top surface of the second substrate.

18. The system according to claim 17, wherein one of the at least one positioning pin is electrically connected to a ground of the circuit board.

19. The system according to claim 17, wherein one of the at least one positioning pin is electrically connected to a power source of the circuit board.

* * * * *